United States Patent [19]
Aswell et al.

[11] Patent Number: 6,100,725
[45] Date of Patent: Aug. 8, 2000

[54] APPARATUS FOR A REDUCED PROPAGATION DELAY DRIVER

[75] Inventors: Cecil J. Aswell, Orangevale, Calif.; Eugene G. Dierschke, Dallas, Tex.

[73] Assignee: Texas Instruments Incorporated, Dallas, Tex.

[21] Appl. No.: 09/052,585

[22] Filed: Mar. 31, 1998

Related U.S. Application Data

[60] Provisional application No. 60/041,761, Mar. 31, 1997.

[51] Int. Cl.[7] .................................................. H03K 3/00
[52] U.S. Cl. ......................... 327/108; 327/374; 327/376; 327/437; 327/377; 327/379
[58] Field of Search .................................. 327/374, 376, 327/377, 379, 108, 437, 551, 554

[56] References Cited

U.S. PATENT DOCUMENTS 5,546,029   8/1996   Koke ........................................ 327/108

*Primary Examiner*—Timothy P. Callahan
*Assistant Examiner*—Cassandra Cox
*Attorney, Agent, or Firm*—Mark E. Courtney; W. James Brady, III; Frederick J. Telecky, Jr.

[57] ABSTRACT

A driver circuit (12) having a reduced propagation delay is provided. The driver circuit (12) includes a first device (56) having an input and operable to switch a supply voltage to a load (14). A second device (54) having an output coupled to the input of the first device (56), operable to turn on the first device upon receipt of a first signal. A third device (66) having an output coupled to the input of the first device (56), operable to turn off the first device upon receipt of a second signal. A kick start circuit (30) coupled to the input for the first device (56), the input for the second device (54), and the input for the third device (66), operable to generate a threshold voltage on the first device (56), the second device (54), and the third device (66). The kick start circuit (30) operable to produce a threshold voltage that is just below the voltage in which the first device (56), the second device (54), and the third device (66) turn on, or conduct.

17 Claims, 3 Drawing Sheets

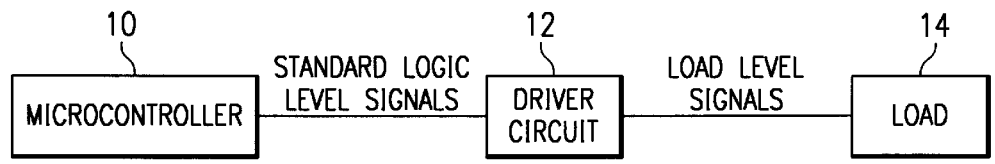
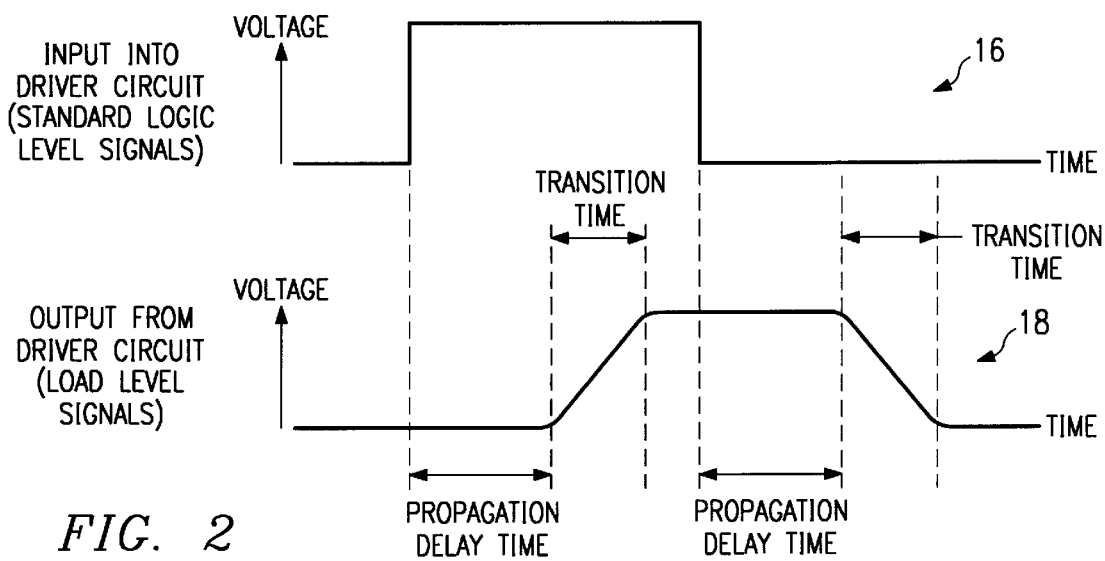
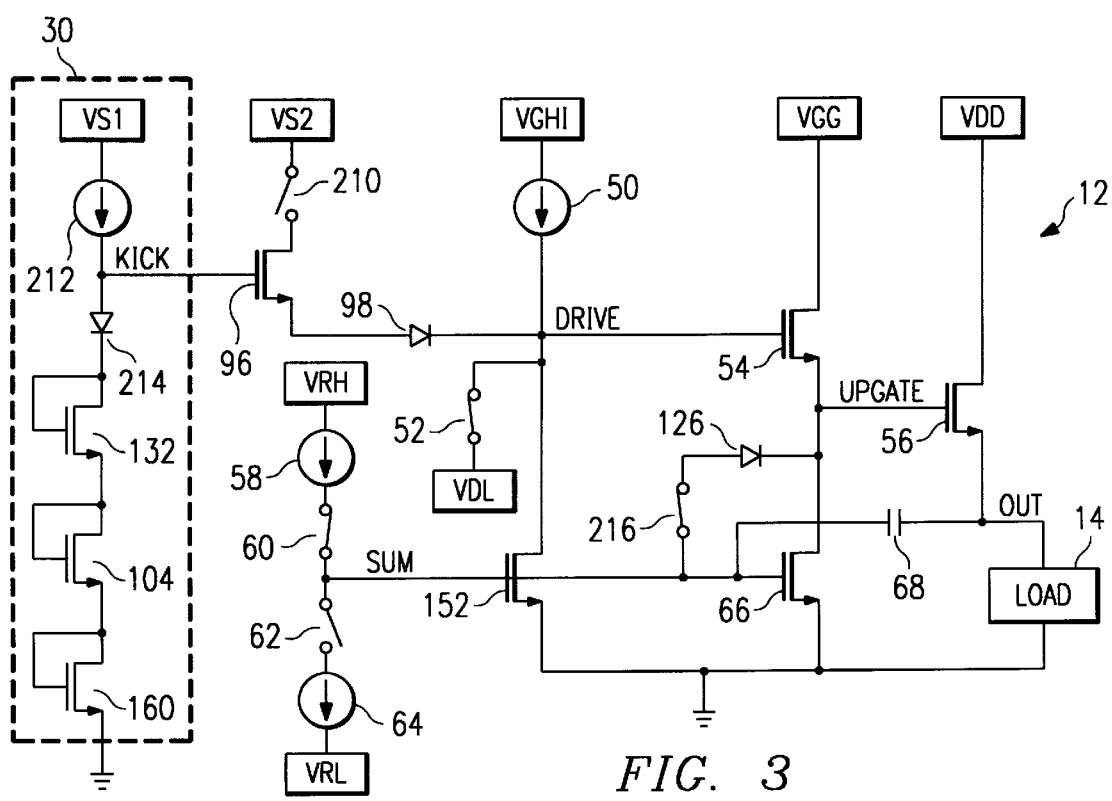

6,100,725

APPARATUS FOR A REDUCED PROPAGATION DELAY DRIVER

This application claims priority under 35 USC § 119(e)(1) of provisional application number 60/041,761 filed Mar. 31, 1997.

CROSS-REFERENCE TO RELATED PATENT APPLICATIONS

This patent is related to the following co-pending patent applications: Ser. No. 09/052,584, entitled Method and Apparatus for a Controlled Transition Rate Driver, and Ser. No. 09/052,596, entitled Method and Apparatus for a Temperature Compensation Circuit. Each of the above entitled copending applications is assigned to Texas Instruments Incorporated.

TECHNICAL FIELD OF THE INVENTION

This invention relates in general to the field of electronic systems, and more particularly to a method and apparatus for a reduced propagation delay driver.

BACKGROUND OF THE INVENTION

The processing speed of modern electronics continues to increase at an incredible pace. The almost yearly increase in computer processor speed is one such example of the increased speed of modern electronics. Many electronic devices incorporate switching or driver circuits for driving high voltage/high current loads. Generally, a driver circuit receives control logic level signals and outputs high voltage/high current signals to a load in response. The input logic level signals control the timing and duration of the high voltage/high current signals output to the load. There is generally a time delay between the moment that a low level control signal is received by a driven circuit and the moment at which the driver circuit outputs the high voltage/high current signal to the load. This delay is known as the propagation delay.

Previously developed driver circuits have suffered from numerous disadvantages. One disadvantage in prior driver circuits is that the propagation delay is excessive and slows down the operating speed of the electronic device. Another disadvantage is that the long propagation delay of prior driver circuits does not allow a supply voltage to be switched off and on quickly. Another disadvantage of prior driver circuits is that the rising and falling propagation times are not the same. In addition, prior driver circuits do not allow control of the transition rate in conjunction with minimizing the propagation delay. A further disadvantage is that prior driver circuits were sensitive to process, supply, and temperature variations.

SUMMARY OF THE INVENTION

Accordingly, a need has arisen for an improved driver with reduced propagation delay. The present invention provides a driver circuit that addresses shortcomings of prior driver circuits.

In accordance with the teachings of the present invention, a driver circuit having a reduced propagation delay is provided. The driver circuit includes a first device having an input and operable to switch a supply voltage to a load. A second device in source follower arrangement, having an output coupled to the input of the first device, operable to turn on the first device upon receipt of a first signal. A third device having an input coupled to the input of the first device, operable to turn off the first device upon receipt of a second signal. A kick start circuit coupled to the input for the first device, the input for the second device, and the input for the third device, operable to generate a threshold voltage on the first device, the second device, and the third device. The kick start circuit may include any number of devices to produce a threshold charge that is just below the charge in which the first device, the second device, and the third device turn on, or conduct. In one embodiment, the first signal and the second signal are complementary.

For some applications, embodiments of the present invention may be preferably manufactured using CMOS technology. However, other technologies may be used to manufacture a reduced propagation delay driver in accordance with teachings of the present invention.

Technical advantages of the present invention include providing a driver circuit having reduced propagation delay times wherein the rising and falling propagation times are essentially equal. Thus, the present invention provides a driver circuit that operates faster than prior driver circuits.

Other technical advantages of the present invention include providing a driver circuit in which the supply voltage is switched off and on quickly, and providing a driver circuit that can be used in conjunction with circuitry that controls the rising and falling transition rates.

A further technical advantage of the present invention is that the driver circuit is not sensitive to process, supply, and temperature variations.

Other technical advantages will be readily apparent to one skilled in the art from the following figures, descriptions, and claims.

BRIEF DESCRIPTION OF THE DRAWINGS

For a more complete understanding of the present invention and for further features and advantages, reference is now made to the following description taken in conjunction with the accompanying drawings, in which:

FIG. 1 is a block diagram of a typical electronic device that utilizes a microcontroller to control a high voltage/high current load;

FIG. 2 is a timing diagram illustrating an exemplary logic level control signal which may be received by a driver circuit and an exemplary load level signal output by the driver circuit in response;

FIG. 3 is a schematic diagram of a driver circuit, according to one embodiment of the present invention;

DETAILED DESCRIPTION OF THE INVENTION

Figure 4:
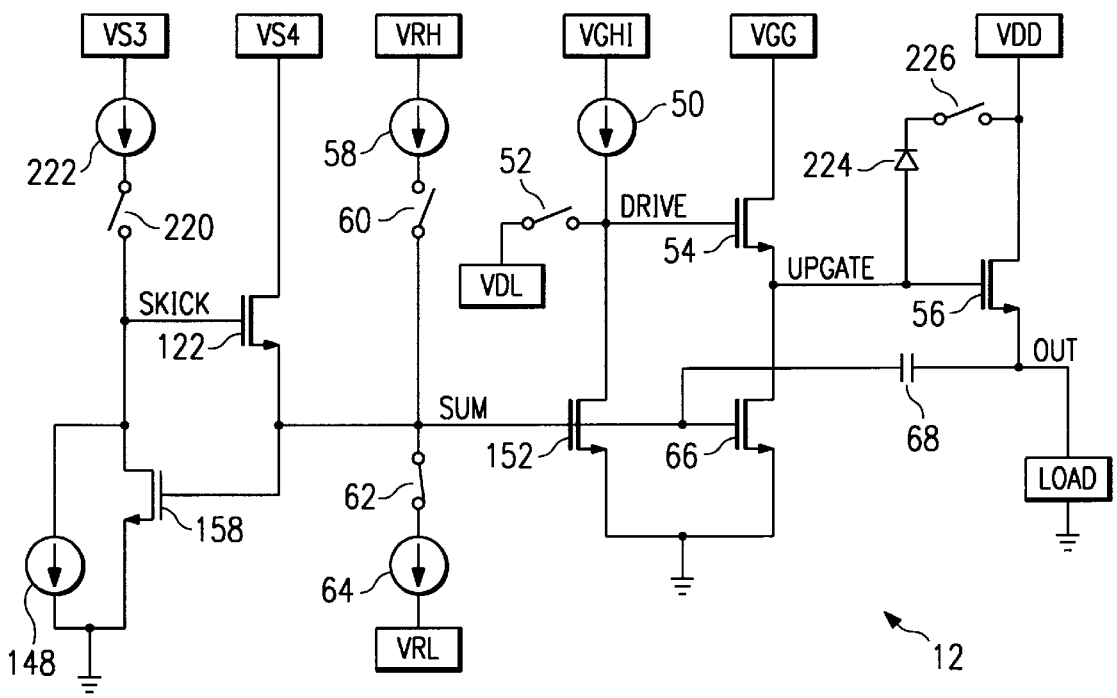
FIG. 4 is a schematic diagram of a driver circuit, according to another embodiment of the present invention.

FIG. 1 is a block diagram showing a typical electronic device 8 that utilizes a microprocessor 10 to control the on/off switching of a supply voltage which forms the load level signals to a load 14. The supply voltage is typically a high voltage/high current supply but may be any supply voltage without departing from the spirit and scope of the present invention. Microprocessor 10 controls the load level signals to load 14 through a driver circuit 12. Driver circuit 12 receives low voltage logic level control signals from microprocessor 10 and converts these signals into load level signals used to control load 14. Load 14 may be any kind of electronic device such as a motor, resistor, or capacitor. Driver circuit 12 allows a microprocessor 10 to control motors and other high voltage/high current devices that microprocessor 10 could not control directly.

FIG. 2 is a timing diagram illustrating an exemplary logic level control signal 16 which may be received by a typical driver circuit and an exemplary load level signal 18 output by the driver circuit in response. Logic level control signal 16 can be a low voltage control signal output from microprocessor 10 and input into driver circuit 12 shown in FIG. 1. Load level signal 18 can be a high voltage/high current, load level signal, which is output from driver circuit 12 in response to the control signal from microprocessor 10. The timing diagram shows the rise and fall transition times and also the propagation delay times. Transition times may be defined as the period of time it takes for the output load level signal to change between 10% and 90% of its final value. The propagation delay time may be defined as the difference in time between a change in the input logic level control signal and the moment that the output load level signal has changed 10% of its final value.

FIG. 3 is a schematic diagram of a driver circuit 12, according to one embodiment of the present invention. As shown, driver circuit 12 includes a device 56 having a source (or an output) and a gate (or an input). Device 56 may be a large high current high voltage lateral DMOS device which switches a supply voltage VDD to a load 14 coupled to the output of device 56. The output of device 56, node OUT, constitutes the output voltage of driver circuit 12. A supply VGG is used to power a gate drive circuit for device 56. A supply VGHI may be a temperature compensated reference supply, as described in copending patent application Ser. No. 09/052,596, entitled Method and Apparatus for a Temperature Compensation Circuit, and incorporated by reference herein. Such temperature compensated reference supply VGHI controls the amount of gate drive applied to device 56.

The output of a device 54 is coupled to the gate or input of device 56. Device 54 may be used as a source follower buffer so that the gate drive for device 56 can be obtained from supply VGG instead of supply VGHI. A device 66 is coupled to the gate of device 56 and the output of device 54 at a node UPGATE. Device 66 is used to control the voltage at node UPGATE. A device 152 is coupled to the gate of device 54 at a node DRIVE. Device 152 is used to control the voltage at node DRIVE. A capacitor 68 is coupled between the output of device 56 (at a node OUT) and the gates of devices 66 and 152 (at a node SUM). Capacitor 68 is used as a Miller feedback capacitor between nodes OUT and SUM. A supply VRH is a reference supply sufficiently large to ensure that devices 66 and 152 are turned on when such supply is applied to their gates (at node SUM). A supply VRL is a reference supply sufficiently small to ensure that devices 66 and 152 are turned off when applied to their gates (at node SUM). A switch 216 and a diode 126 are coupled in series between node SUM and node UPGATE.

A temperature compensated current source 50 is coupled between supply VGHI and the gate of device 54 at node DRIVE. A current source 58 is coupled between supply VRH and a switch 60. Switch 60 is used to connect current source 58 to node SUM. Similarly, a current source 64 is coupled between a switch 62 and supply VRL. Switch 62 is used to connect current source 64 to node SUM. Current sources 50, 58, and 64 are used to control drive circuit 12. A diode 98 is coupled between the output of a device 96 and node DRIVE. The gate of device 96 is coupled to a kick start circuit 30 at a node KICK. A switch 210 is connected between a signal input VS2 and device 96.

Kick start circuit 30 in this embodiment comprises a current source 212 connected between a signal input VS1 and node KICK. A diode 214, a device 132, a device 104, and a device 160 are coupled in series between node KICK and ground. Kick start circuit 30 operates to produce a threshold voltage at node KICK that is just below the voltage in which the devices 54, 56, and 66 turn on, or conduct. The embodiment of driver circuit 12 as shown in FIG. 3 is used to control the rising transition propagation delay time of the load level signal at node OUT, which constitutes the output voltage of driver circuit 12. It must be understood that in other embodiments the drain, rather than the source, of a device may be that device's output.

The embodiment of driver circuit 12 shown in FIG. 3 operates by minimizing the propagation time at node OUT by rapidly charging the nodes UPGATE and SUM to the appropriate threshold voltage. This driver circuit 12 is used to establish the appropriate threshold voltages on nodes UPGATE and SUM at the beginning of the rising edge transition in which output device 56 is being turned on and the output voltage, node OUT, goes from low to high voltage. The driver circuit 12 is shown in its initial state with output device 56 in an off-state. Initially switch 62 is open and switch 60 is closed so that devices 152 and 66 are turned on. Also, initially switch 210 is open and switch 52 is closed. Nodes DRIVE and UPGATE are low and devices 54 and 56 are turned off. Node OUT will be at ground potential.

The circuit consisting of switch 216 and diode 126 is used to clamp the voltage on node SUM. Initially switch 216 is closed. Thus, the voltage at node SUM ("$V_{SUM}$") is:

$$V_{SUM} = VF_{126} + VDS_{66}$$

where "$VF_{126}$" is the forward bias across diode 126 and "$VDS_{66}$" is the voltage drop between the drain and source of device 66.

This ensures that gate to source voltages of devices 152 and 66 (e.g., "$VGS_{152}$" and "$VGS_{66}$") are such that these devices are in active region and near the operating point for Miller action at start of the rising edge transition at node OUT.

To start the turn-on transition, switches 52, 60, and 216 are opened and switches 62 and 210 are closed. The kick start circuit, which functions to rapidly bring node UPGATE to an appropriate operating voltage, consists of switch 210, current source 212, devices 96, 132, 104, and 160 and diodes 98 and 214. Device 96 acts as a source follower. The voltage on node UPGATE ("$V_{UPGATE}$") is:

$$V_{UPGATE} = V_{KICK} - VGS_{96} - VF_{98} - VGS_{54}$$

where "$V_{KICK}$" is the voltage at node KICK, "$VGS_{96}$" is the voltage drop between the gate and source of device 96, "$VF_{98}$" is the forward bias across diode 98, and "$VGS_{54}$" is the voltage drop between the gate and source of device 54.

The voltage on node KICK is generated by having a current from current source 212 flowing through devices 214, 132, 104, and 160. Thus, $$V_{KICK} = VF_{214} + VGS_{132} + VGS_{104} + VGS_{160}$$

where "$VF_{214}$" is the forward bias across diode 214, "$VGS_{132}$" is the voltage drop between the gate and source of device 132, "$VGS_{104}$" is the voltage drop between the gate and source of device 104, and "$VGS_{160}$" is the voltage drop between the gate and source of device 160.

By design, $$VF_{214} = VF_{98}$$

$$VGS_{132} = VGS_{96}$$

$$VGS_{104} = VGS_{54}$$

Thus, $$V_{UPGATE} = VGS_{160}$$

and $$V_{UPGATE} = VGS_{56} + V_{OUT}$$

where "$VGS_{56}$" is the voltage drop between the gate and source of device 56 and "$V_{OUT}$" is the voltage at node OUT.

Since node OUT is initially at ground potential, then $$VGS_{56} = VGS_{160}$$

and is rapidly brought to the proper operating point to start the controlled risetime during turn on.

FIG. 4 is a schematic of another embodiment of a driver circuit 12 according to the present invention. The circuit shown in FIG. 4 is used to establish the appropriate voltages on nodes UPGATE and SUM at the beginning of the output falling edge transition in which output device 56 is being turned off and voltage at node OUT goes from high to low. The circuit is shown in the initial state with output device 56 turned on. Initially switch 62 is closed and switches 52, 60, 220, and 226 are open. Thus:

$$V_{UPGATE} = VGHI - VGS_{54}$$
$$V_{OUT} = VDD - VDS_{56}$$
$$VGS_{56} = V_{UPGATE} - V_{OUT}$$
$$= VGHI - VDD - VGS_{54} + VDS_{56}$$

where "$VDS_{56}$" is the voltage drop between the drain and source of device 56.

To start the turn-off transition, switch 62 is opened and switches 52 and 60 are closed. The circuit consisting of switch 226 and device 224 is used to initially bring the voltage at node UPGATE down rapidly to the appropriate operating voltage for the controlled transition rate transition to minimize propagation delay time. Switch 226 is momentarily closed causing:

$$VGS_{56} = V_{UPGATE} - V_{OUT}$$
$$= VF_{224} + VDS_{56}$$

where "$VF_{224}$" is the forward bias across diode 224.

The circuit consisting of switch 220, current sources 222 and 148, and devices 158 and 122 is used to bring the voltage at node SUM rapidly to the appropriate operating voltage for the controlled transition rate to minimize propagation delay time. Initially switch 220 is open and weak current pulls node SKICK to ground potential. During output turn-off, switch 220 is momentarily closed causing the voltage at node SKICK to increase. Device 122 acts as a source follower and pulls the voltage at node SUM up until device 158 turns on, clamping the voltage at node SKICK, and thus the voltage at node SUM. During this transient, device 158 becomes a single stage high gain amplifier with negative feedback through source follower device 122. Node SUM is driven to a voltage sufficient to sink the current from current source 222. Node SUM will be at the proper voltage for the transition rate limiting action of Miller amplifier 152 to occur.

Figure 5:
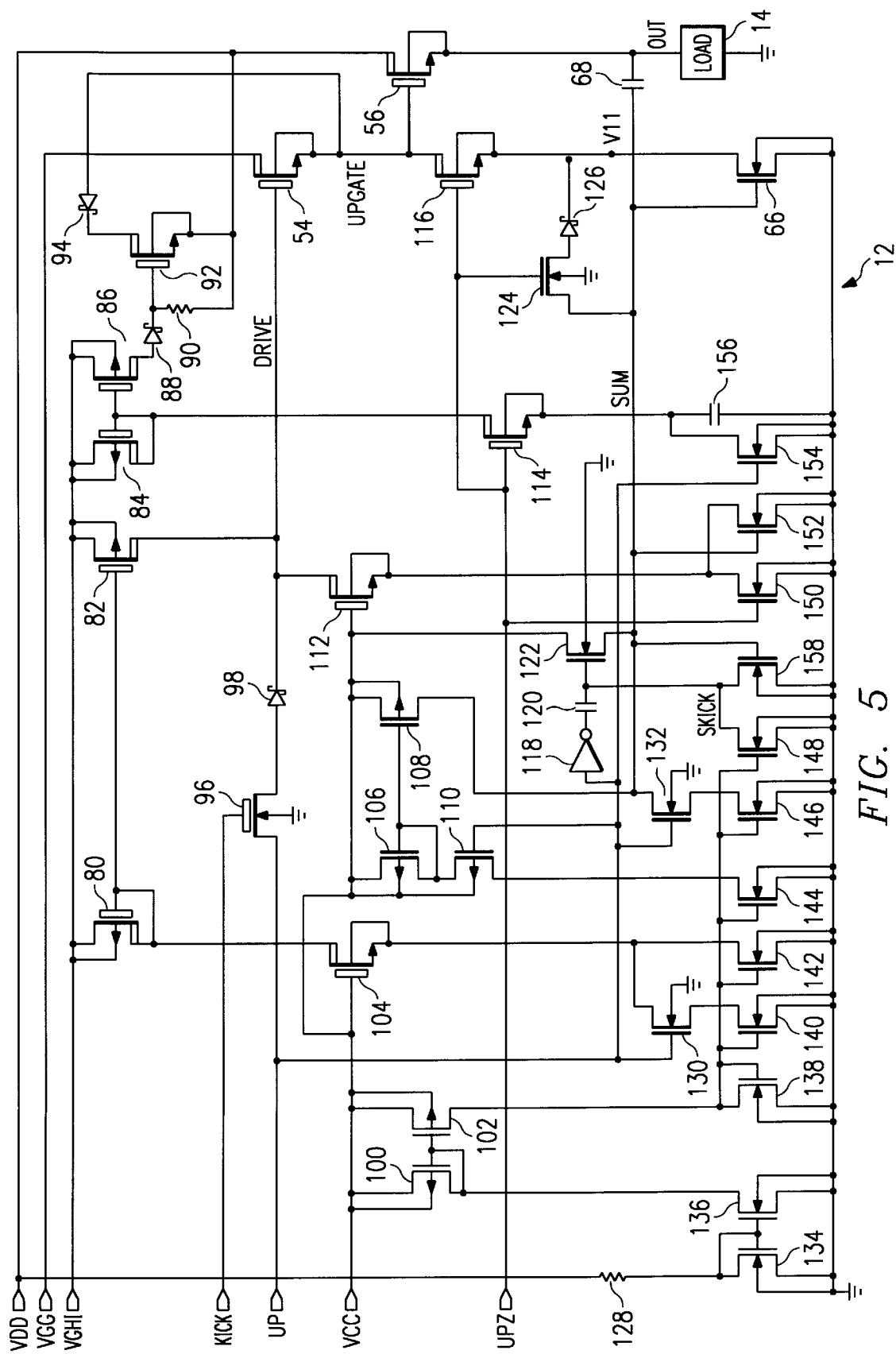
FIG. 5 is a schematic diagram of a driver circuit, according to another embodiment of the present invention.

FIG. 5 is a schematic of another embodiment of a high side driver circuit 12 according to the present invention. FIG. 5 incorporates the teachings of copending patent application Ser. No. 09/052,596, entitled Method and Apparatus for a Temperature Compensation Circuit, and copending patent application Ser. No. 09/052,584, entitled Method and Apparatus for a Controlled Transition Rate Driver, each of which are incorporated into this application by reference.

During output transitions, device 56 functions as a source follower with a resistive load. The key to controlling the rise and fall transition times accurately is to control the rise and fall times of node UPGATE. In its simplest logic function, node UPGATE goes high when signal UP goes high and goes low when signal UP goes low. (signals UP and UPZ are complementary signals.) Node UPGATE is driven high when the gate of device 54 (at node DRIVE) goes high, and is pulled low by device 66 through cascode switch device 116.

To understand the functionality of this circuit, assume the device is in a steady state with signal UP low and signal UPZ high, thereby signaling node OUT to be in an off state. Current flows through resistor 128 and diode-connected device 134. This current through resistor 128 ("$I_{128}$") is:

$$I_{128} = \frac{VDD - VGS_{134}}{R_{128}}$$

where "$VGS_{134}$" is the voltage drop between the gate and source of device 134 and "$R_{128}$" is the value of resistor 128. Since $VGS_{134}$ is much less than VDD, the current is approximately proportional to VDD.

This current is mirrored through devices 136, 100 and 102 to diode-connected device 138, which sets up proportional currents in devices 140, 142, 144, 146 and 148. Current from device 144 is mirrored through devices 110/106 by device 108 into node SUM. Because signal UP is low, device 132 is off and therefore node SUM goes high, turning on devices 152 and 66. Device 130 is turned off. Device 150 is turned on by signal UPZ, sinking the current from current source 82 through cascode device 112 and consequentially pulling the gate of device 54 (at node DRIVE) low. This turns off device 54. At the same time, the voltage at node UPGATE is pulled low by device 66 through cascode device 116, causing device 56 to be turned off.

When node OUT is low, the voltages at node UPGATE and node DRIVE are near ground. Node OUT only begins to turn on when node UPGATE goes sufficiently positive to start turning on device 56. For this to occur, the voltage at the gate of device 54 (at node DRIVE) must be at least two threshold voltages above ground plus sufficient overdrive to charge the gate or input of device 56. Under nominal conditions this voltage is approximately 2–2.5 volts for this embodiment. To minimize the propagation delay time, it is necessary to get the gates of devices 56 and 54 to the proper point as quickly as possible after the transition of control signals UP and UPZ.

Figure 6:
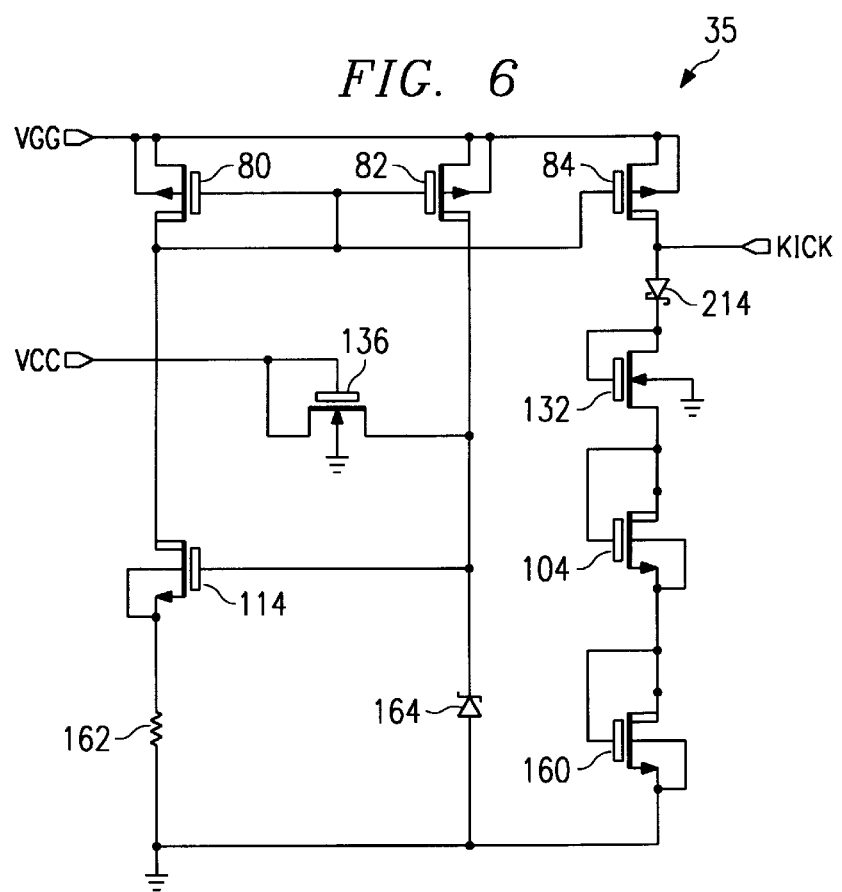
FIG. 6 is a schematic diagram of a kick start circuit, according to an embodiment of the present invention.

In order to get to the proper turn on voltage at these nodes, a kick start circuit 35 as shown in FIG. 6 is used to charge, or kick start, the gate of device 54 to the threshold value. It is important that the kick start circuit 35 get the gates of device 54 and device 56 very close to the appropriate threshold voltages. If the voltage at node KICK is too strong, the output of drive circuit 12 (at node OUT) will exhibit a step followed by a ramp which degrades the rise time measurement as well as contributing to electromagnetic interference. If the voltage at node KICK is too small, the delay through driver circuit 12 will be excessive.

The kick start is accomplished by applying the proper voltage to the gate of device 54 through devices 96 and 98 when signal UP is applied to device 96. Device 96 acts as a source follower to the voltage at node KICK. The voltage at node KICK is produced by kick start circuit 35. Kick start circuit 35 is a bias circuit that tracks the threshold voltages of the lateral DMOS devices 54 and 56, the threshold voltage of device 96, and the voltage drop of device 98 such that the output of driver circuit 12 (at node OUT) turns on with a minimum delay and a minimum step.

Another embodiment of the circuit for generating the threshold voltage at node KICK is shown in FIG. 6. Kick start circuit 35 comprises device 114, resistor 162, zener diode 164, and devices 80 and 82 form a current reference. Device 136 assures the initial startup of the current reference. Once the current reference is started, device 136 is back biased and is no longer active. The current through device 80 ("$I_{80}$") is:

$$I_{80} = \frac{VZ_{164} - VGS_{114}}{R_{162}}$$

Where "$VZ_{164}$" is the voltage across zener diode 164, "$VGS_{114}$" is the voltage drop between the gate and source of device 114, and "$R_{162}$" is the value of resistor 162. The current through device 80 is mirrored by device 82 which keeps diode 164 biased in its zener breakdown region. The current through device 80 is also mirrored through device 84. The current from device 84 flows through zener diode 214, device 132 and diode connected devices 104 and 160. Since these devices have the same threshold voltages and forward biases as their counterparts (devices 96, 98, 54 and 56 shown in FIG. 5) the voltage at node KICK will track appropriately across temperature and process variations. In other words, the voltage at node KICK will be such that when signal UP is applied to device 96, the voltage that subsequently appears at the gate of device 56 will be at the proper voltage to just start turning it on under all variations of temperature, process, and supply voltage.

In addition to getting device 56 to the turning on point, it may also be necessary for the Miller amplifier circuit controlling the transition rate to be near the correct bias, or threshold, point. More specifically, if node SUM is too high there will be a turn on delay since device 152 will be turned on more than is required to control the rise in node OUT. If node SUM is too low there will be a step in the output until node SUM is charged to the proper value through Miller capacitor 68. Note that because of the action of devices 124 and 126, when the column is turned off, node OUT will be driven to ground. When this occurs dv/dt=0 and there is no longer Miller current through Miller capacitor 68. The transition rate control current from device 108 will continue to flow causing node SUM to rise. After node OUT reaches ground, node UPGATE and node Vil will approach ground potential, forward biasing device 126. This clamps the current at node SUM to a value that keeps the gate to source voltage of device 66, and consequently device 152, in the active region and near the correct operating point for Miller action when the UP signal is asserted.

An analogous situation exists when switching from high to low. When the column is in the on state, the voltage at the gate of device 56, node UPGATE, may be from 6 to 13 volts above the source. In order to start turning off device 56, it is necessary to get the gate to source voltage of device 56 near its threshold. This is accomplished as follows:

When UPZ goes high, capacitor 156 can be charged to about 3.5 volts through device 114 within a few nanoseconds. The current pulse for charging capacitor 156 flows through device 84 and is mirrored up by a factor of two by device 86. This mirrored current pulse from device 86 charges the gate of device 92 sufficiently to turn it on strongly for a few hundred nanoseconds, until the gate charge is bled off by resistor 90. Turning on device 92 quickly discharges the voltage at the gate of device 56 (node UPGATE) to about 2 volts above VDD through device 94, at which point device 56 starts turning off and node OUT (source of device 56) starts dropping.

As in the rising transition, it is desirable for the transition rate control circuitry to be at the proper threshold when the output starts going down in order to control the transition time. Before node OUT switches low, node SUM will normally have been pulled to ground by current source 146. Inverter 118, capacitor 120, and devices 122, 148 and 158 perform the function of getting the voltage at node SUM to the proper operating point. Prior to signal UP going low, node SKICK (gate of device 122) is pulled to ground by weak current source device 148. When UP goes low, the output of inverter 118 goes high. This transition is capacitively coupled to the gate of device 122 through device 120. Device 122 acts as a source follower and pulls the voltage at node SUM up until device 158 turns on, clamping the voltage at node KICK and consequently node SUM. Note that during this transient, device 158 becomes a single stage high gain amplifier with negative feedback through source follower device 122. The gate of device 158 (node SUM) will be driven to a voltage sufficient to sink the current being supplied through device 120. Since devices 158 and 152 are the same type of transistors, this means that node SUM is very near the proper voltage for the transition rate limiting action of Miller amplifier device 152 to occur. Weak current source device 148 will then quickly bring the voltage at node KICK back to ground.

In short, the action of the kick start circuit 35 is to quickly bring node SUM to the proper voltage at the same time the charge is being dumped from node UPGATE by device 92 so that transition rate control is active as soon as the output starts falling.

Although the present invention and its advantages have been described in detail, it should be understood that various changes, substitutions, and alterations can be made therein without departing from the spirit and scope of the present invention as defined by the appended claims. For example, driver circuit 12 has been described as a "high side" driver. However, the inventive concept may also apply to other drivers, such as "low side" or "totem-pole" drivers.

What is claimed is:

1. A reduced propagation delay driver comprising:
   a first device, operable to switch a supply voltage to a load;
   a second device coupled to an input for the first device in source follower arrangement, the second device operable to turn on the first device upon receipt of a first signal; and
   a kick start circuit coupled to the input for first device and an input for the second device, the kick start circuit operable to generate a threshold voltage at the inputs for the first device and the second device.

2. The reduced propagation delay driver of claim 1, further comprising:
   a third device coupled to the input for the first device, an output for the second device, and having an input coupled to the kick start circuit, the kick start circuit operable to generate a threshold voltage at an input for the third device; and the third device operable to turn off the first device upon receipt of a second signal, the second signal being the complement of the first signal.

3. The reduced propagation delay driver of claim 1, further comprising:

a first diode coupled between the input for the second device and the kick start circuit; and a fourth device coupled between the first diode and the kick start circuit, the fourth device operable to receive the first signal.

4. The reduced propagation delay driver of claim 1, said kick start circuit further comprising a fifth device coupled to the input for the second device, the fifth device operable to turn off the second device.

5. The reduced propagation delay driver of claim 2, further comprising a capacitor coupled between an input for the third device and an output for the first device.

6. The reduced propagation delay driver of claim 1, wherein the kick start circuit comprises:

a current source;

a second diode coupled to the current source; and a sixth device coupled to the second diode.

7. The reduced propagation delay driver of claim 1, wherein the kick start circuit comprises:

a current source;

a second diode coupled to the current source; and a sixth device, a seventh device, and a eighth device coupled in series to the second diode.

8. The reduced propagation delay driver of claim 1, wherein the first device is a LDMOS transistor.

9. A reduced propagation delay driver comprising:

a first device, operable to switch a supply voltage to a load;

a third device coupled to an input for the first device, the third device operable to turn off the first device upon receipt of a second signal; and a kick start circuit coupled to the input for first device and an input for the third device, the kick start circuit operable to generate a threshold voltage at the inputs for the first device and the third device.

10. The reduced propagation delay driver of claim 9, further comprising:

a second device coupled to the input for the first device, an output for the third device, and having an input coupled to the kick start circuit, the kick start circuit operable to generate a threshold voltage at the input for the second device; and the second device operable to turn on the first device upon receipt of a first signal, the first signal being the complement of the second signal.

11. The reduced propagation delay driver of claim 9, wherein the kick start circuit comprises:

a current source;

a second diode coupled to the current source; and a sixth device coupled to the second diode.

12. The reduced propagation delay driver of claim 9, wherein the kick start circuit comprises:

a current source;

a second diode coupled to the current source; and a sixth device, a seventh device, and a eighth device coupled in series to the second diode.

13. A reduced propagation delay driver comprising:

a first device operable to switch a supply voltage to a load;

a second device coupled to an input for the first device, the second device operable to turn on the first device upon receipt of a first signal;

a third device having an output coupled to an input for the first device and to an output for the second device, the third device operable to turn off the first device upon receipt of a second signal at an input to the third device; and a kick start circuit coupled to the input for the first device, an input for the second device, and an input for the third device, the kick start circuit operable to generate a threshold voltage at the inputs for each of the first device, the second device, and the third device.

14. The reduced propagation delay driver of claim 13, wherein the first signal is the complement of the second signal.

15. The reduced propagation delay driver of claim 13, further comprising:

a first diode coupled between the input for the second device and the kick start circuit; and a fourth device having an output coupled to the first diode and an input coupled to the kick start circuit, the fourth device operable to receive the first signal.

16. The reduced propagation delay driver of claim 13, further comprising a fifth device coupled to the input for the second device, the fifth device operable to turn off the second device.

17. The reduced propagation delay driver of claim 13, wherein the kick start circuit comprises:

a current source;

a first diode coupled to the current source; and a sixth device coupled to the second diode.

* * * * *